(12) United States Patent
Bader et al.

(10) Patent No.: US 10,572,622 B2
(45) Date of Patent: Feb. 25, 2020

(54) INTERCONNECT REUSE RESOLUTION WITH BUMP COMPENSATION IN A PACKAGE DESIGN

(71) Applicant: Mentor Graphics Corporation, Wilsonville, OR (US)

(72) Inventors: Frank Bader, Algonquin, IL (US); John Medina, Fair Oaks, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 204 days.

(21) Appl. No.: 15/362,346

(22) Filed: Nov. 28, 2016

(65) Prior Publication Data

US 2018/0150588 A1 May 31, 2018

(51) Int. Cl.
*G06F 17/50* (2006.01)
(52) U.S. Cl.
CPC ................. *G06F 17/5077* (2013.01)
(58) Field of Classification Search
USPC ........................................ 716/126
See application file for complete search history.

(56) References Cited

U.S. PATENT DOCUMENTS

| | | | | |
|---|---|---|---|---|
| 2006/0214307 A1* | 9/2006 | Chang | ............... | G06F 17/5068 257/778 |
| 2006/0271898 A1* | 11/2006 | Kitamura | ............ | G06F 17/5077 716/129 |
| 2017/0249414 A1* | 8/2017 | Lin | ................... | G06F 17/5077 |

* cited by examiner

*Primary Examiner* — Eric D Lee
(74) *Attorney, Agent, or Firm* — Mentor Graphics Corporation

(57) ABSTRACT

This application discloses a computing system to export route data and connectivity data from a layout design of a package device. The route data describes a structure of an interconnect in the package device. The connectivity data characterizes an electrical interface between a first integrated circuit and the package device in the layout design. The computing system, based on the connectivity data associated with the first integrated circuit, can correlate the route data to pins of a second integrated circuit and identify net names for the route data and the second integrated circuit. The computing system can import the route data and the connectivity data to the layout design, which selectively realigns the route data in the layout design with the pins in the second integrated circuit, and also can allow the computing system to change net names corresponding to the route data connecting to the second integrated circuit.

20 Claims, 9 Drawing Sheets

LAYOUT DESIGN 600

LAYOUT DESIGN 600

MODIFIED LAYOUT DESIGN 601

ROUTE-TO-PIN MISALIGNMENT

ROUTE-TO-PIN REALIGNMENT

INTERCONNECT REUSE RESOLUTION WITH BUMP COMPENSATION IN A PACKAGE DESIGN

TECHNICAL FIELD

This application is generally related to electronic design automation and, more specifically, to interconnect reuse resolution with bump compensation in a package design.

BACKGROUND

In electronics manufacturing, integrated circuit packaging refers to encapsulating an integrated circuit formed on a semiconductor die into a package device, such as a case, housing, or the like. The package device can help protect the semiconductor die from its environment, for example, from physical damage, corrosion, or the like. The package device also can include an interconnect to electrically connect interface pins of the semiconductor die to leads or solder bumps of the package device.

As complexity of integrated circuits grows, so too has the complexity of package devices. For example, some package devices may be designed to accommodate multiple semiconductor dies, each including thousands of pads, pins, or solder bumps to be supported by the interconnect in the package device. These package devices can include many stacked layers with traces to route connections on a layer and vias to provide inter-layer electrical connectivity.

Package device design is often performed concurrently with design and/or testing of the integrated circuit(s). While this concurrent design of the integrated circuit(s) and a corresponding package device can speed up development time, alterations in a design of the integrated circuit(s) can prompt re-design in the package design. For example, a manufacturer can perform environmental testing on a physical layout design of an integrated circuit to estimate manufacturing yield and/or reliability of a manufactured integrated circuit. Based the results of this testing, the physical layout design can be modified, for example, slightly shifting pins of the integrated circuit to new locations in an attempt to improve yield or reliability. In some examples, this modification of the physical design layout can cause designers to manually modify the package design with a design tool, for example, a user manually provides input to the design tool to re-align traces or vias in the package design, to re-assign net names to routes in the package design, or the like.

SUMMARY

This application discloses tools or mechanisms, for example, implemented in a computing system, to perform bump compensation or other package design offset correction operations for a package device. The computing system can export route data and connectivity data from a layout design of a package device. The route data can describe a structure of an interconnect in the package device, such as physical layout of traces, vias, and plane shapes on the various layers of the package device. The connectivity data can characterize an electrical interface between a first integrated circuit and the package device in the layout design. The connectivity data can include names of nets associated with pins of the first integrated circuit, which can be associated with the exported route data. The connectivity data also can identify a layer of the package device, identify a number of pins on the first integrated circuit, identify a number of pins on each net, identify locations of pins, such as an x-y location on the semiconductor die of the first integrated circuit, or the like.

The computing system can receive a circuit design for a second integrated circuit, for example, a library part and corresponding netlist associated with the second integrated circuit. In some examples, the circuit design of the second integrated circuit can replace a circuit design of the first integrated circuit used in the layout design for the package device. In other examples, the circuit design of the second integrated circuit can be another circuit design for the package device to couple to on a different portion of the layout design for the package device than the first integrated circuit. For example, some system developers may intend to include multiple copies of a same integrated circuit, such as a processing device, a memory device, or the like, in different portions of the package device.

The computing system, based on the connectivity data associated with the first integrated circuit, can correlate the route data to pins of the second integrated circuit and identify net names for the route data and the second integrated circuit. In some example, this correlation can be in the form of a net mapping matrix or table, which can be built by the computing system based on the connectivity data.

The computing system can import the route data and the connectivity data to the layout design of the package device. The import operation performed by the computing system can include a scaling of the connectivity data and/or a modification of the route data. For example, since the connectivity data identifies locations of pins in the first integrated circuit design, the computing system can compare the circuit design of the first integrated circuit to the circuit design of the second integrated circuit to determine shifts in pins between the circuit designs of the two integrated circuits. Based on this shift, the computing system may be able to scale the connectivity data associated with the first integrated circuit based on the determined shifts in the pins. The computing system also can determine a difference in positioning of the two integrated circuits in the package design and modify the route data associated with the first integrated circuit based on the difference in positioning between the circuit designs of the two integrated circuits. For example, the computing system can rotate and/or mirror the route data based on the difference in positioning between the circuit designs of the two integrated circuits.

The computing system also can selectively realign the route data in the layout design with the pins in the second integrated circuit. In some embodiments, this selective realignment can be based on how endpoints of the route data align with corresponding pins of the second integrated circuit. For example, when the endpoints of the route data are misaligned with corresponding pins of the second integrated circuit, but within a predetermined threshold distance from each other, the computing system can automatically alter the route data to re-align the endpoints of the route data to the pins described in the circuit design of the second integrated circuit. The computing system also can change net names corresponding to the route data connecting to the second integrated circuit. Embodiments will be described below in greater detail.

DETAILED DESCRIPTION

Illustrative Operating Environment

Figure 1:
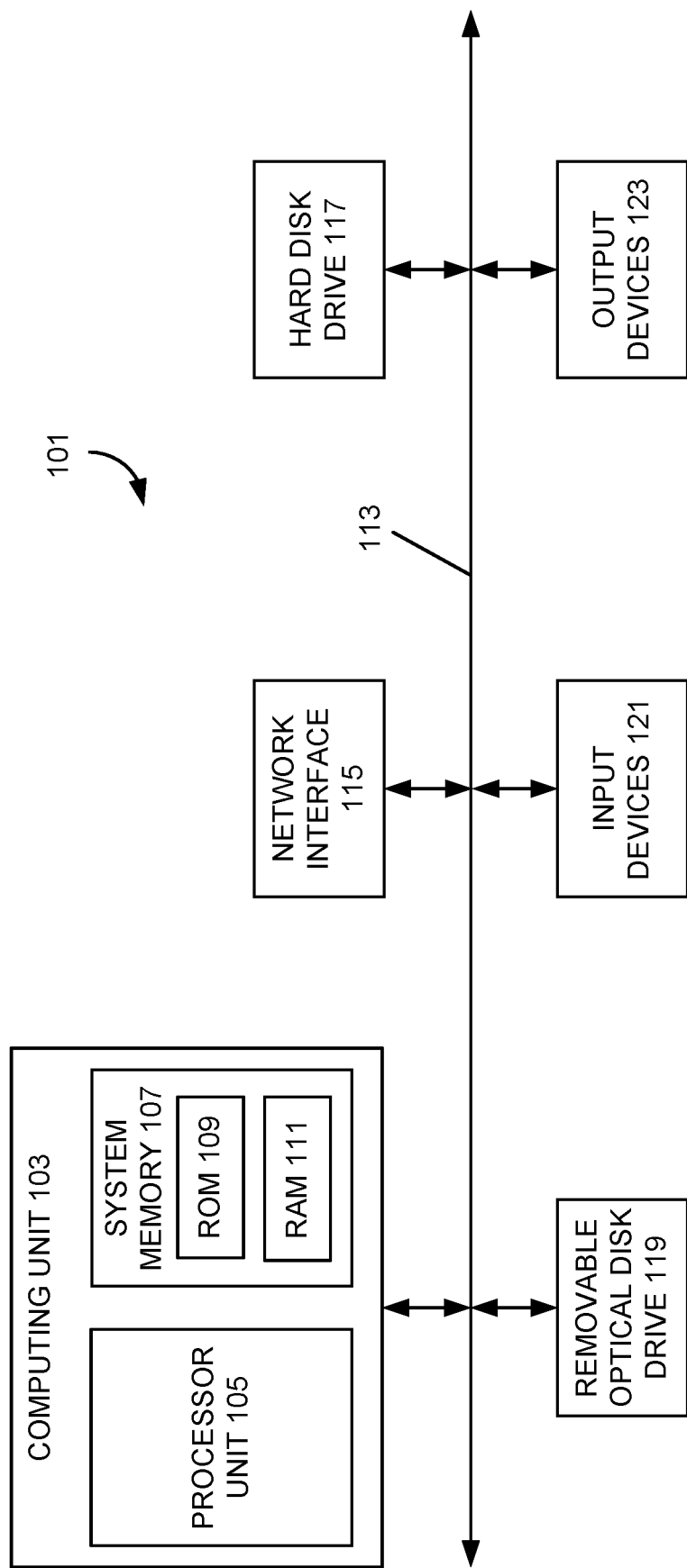
FIGS. 1 and 2 illustrate an example of a computer system of the type that may be used to implement various embodiments of the invention.

Various examples of the invention may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
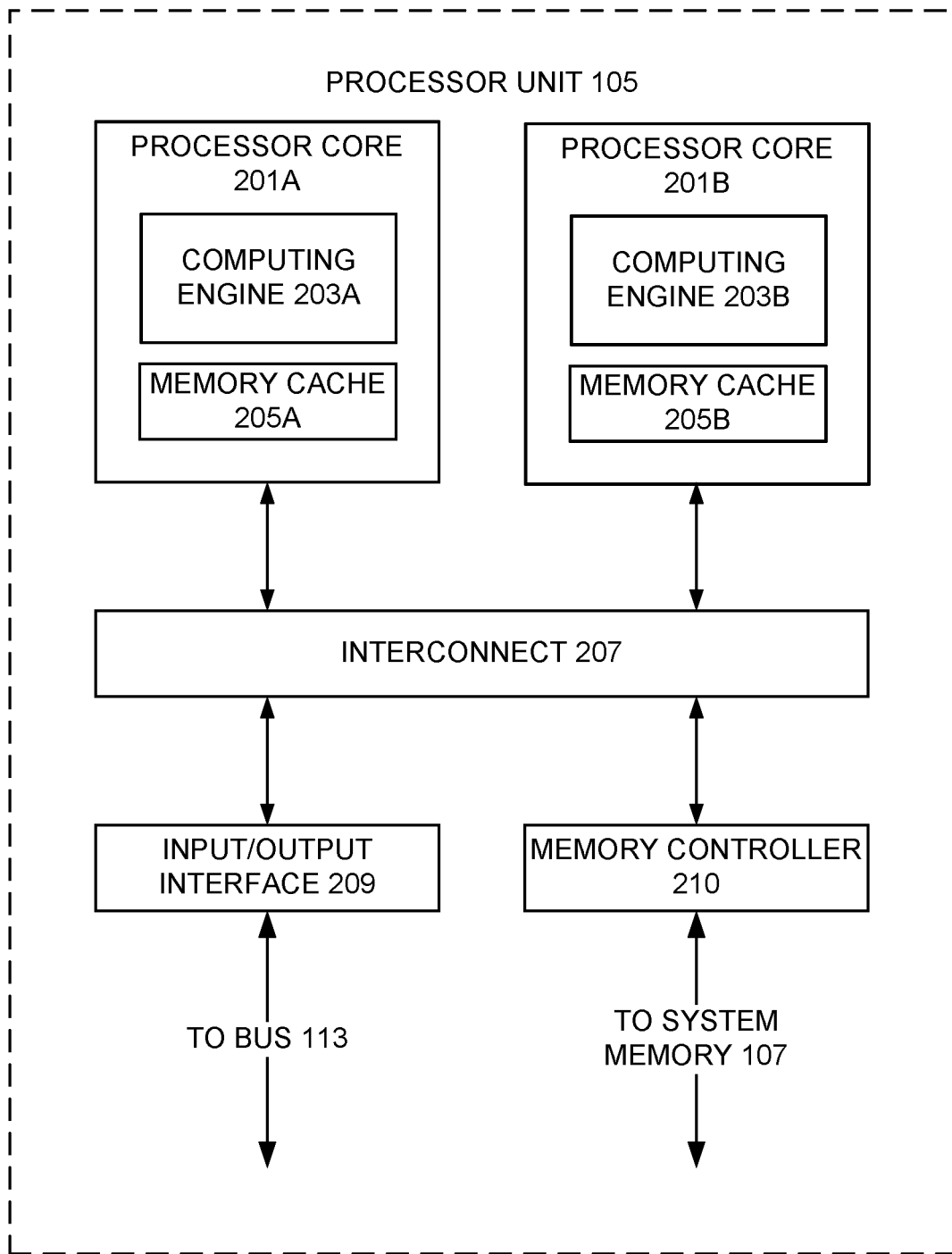

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations of the invention, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments of the invention.

Bump Compensation in Package Design

Figure 3:
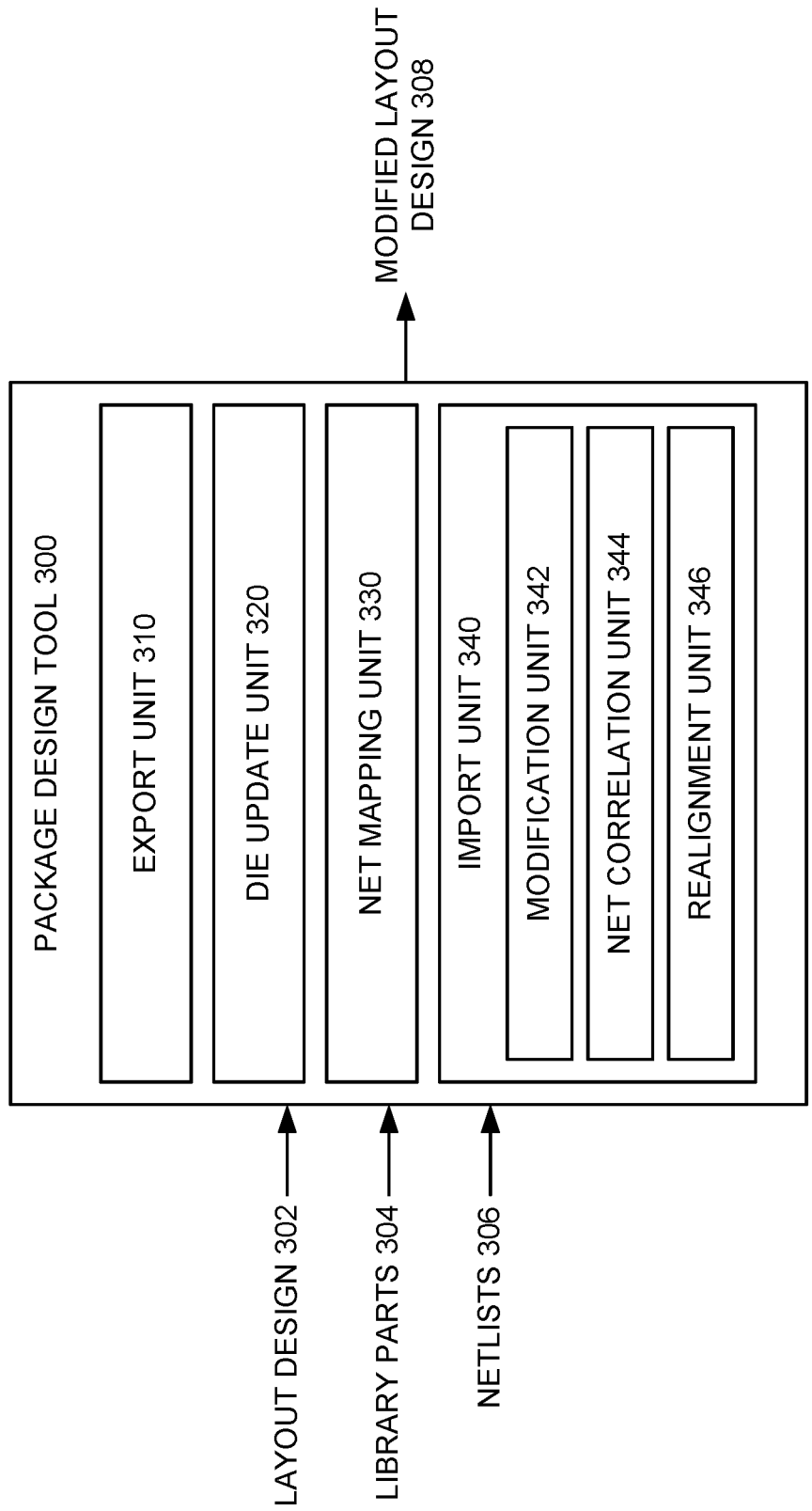
FIG. 3 illustrates an example of a package design tool according to various embodiments of the invention.

FIG. 3 illustrates an example of a package design tool 300 according to various embodiments of the invention. Referring to FIG. 3, the package design tool 300 can receive or generate a layout design 302, which can describe a physical layout of a package device. The package device can be a structure configured to support one or more semiconductor dies for installation into an electronic system. In some embodiments, the package device can encapsulate the semiconductor dies, for example, protecting the semiconductor dies from physical damage, corrosion, or other environmental conditions in the electronic system.

The package device can include an interconnect to electrically couple interface pins of integrated circuits implemented in the semiconductor dies to external pins of the package device. The package device can connect its external pins to the electronic system during installation, which can allow the integrated circuits implemented in the semiconductor dies to electrically connect to the electronic system via the interconnect of the package device. The interface pins of the semiconductor dies can correspond to solder bumps, wires, pins, or the like, mounted or bonded to interface pads of the semiconductor dies. The external pins of the package device can correspond to solder bumps, pins, electrical leads, or the like, of the package device. In some embodiments, the package device can includes multiple stacked layers and the interconnect structure can include traces to route connections on layers and vias to provide inter-layer electrical connectivity.

The package design tool 300 also can receive library parts 304 and associated netlists 306, which can describe the integrated circuits implemented on the semiconductor dies. The library parts 304 can describe a physical structure of the integrated circuits implemented on the semiconductor dies, for example, locations of the interface pins, physical structure of the interface pins, the size of the semiconductor dies, or the like. The netlists 306 can describe the nets associated with the interface pins in the semiconductor dies.

The package design tool 300 can utilize the library parts 304 and associated netlists 306 in the generation or modification of the layout design 302 of the package device. In some embodiments, the package design tool 300 can receive a different version of one of the library parts 304 and associated netlists 306. Since the different version of the library part and associated netlist can result in shifts in locations of the interface pins, a different number of the interface pins, net-to-pins reassignments, or the like, the package design tool 300 can analyze the different version of the library part and associated netlist and, based on the analysis, automatically modify the layout design 302 of the package device to generate a modified layout design 308. The modified layout design 308 can include a realigned interconnect based on the shifts in locations of the interface pins, renamed nets corresponding to the interconnect, or the like.

In some embodiments, the package design tool 300 can utilize at least one of the library parts 304 and associated netlists 306 multiple times in the layout design 302. The package design tool 300 can identify a portion of the layout design 302 utilized to support one instance of the library part, and reuse the identified portion of the layout design 302 in another portion of the layout design 302 to support another instance of the library part. The package design tool 300 can generate the modified layout design 308 with the reused portions of the layout design 302.

In some embodiments, the package design tool 300 also can modify the layout design 302 with a portion of a different layout design. For example, the package design tool 300 can identify a layer in the different layout design to use in the layout design 302, and modify the layout design 302 to include the identified layer. The package design tool 300, in some embodiments, can re-map the identified layer to a different layer of the layout design 302 than was utilized in the different layout design. For example, the layer in the different layout design may correspond to layer 15, and the package design tool 300 can modify the layout design 302 to have the identified layer be included on layer 18 of the modified layout design 308.

The package design tool 300 can include an export unit 310 to extract route data and connectivity data from the layout design 302 of the package device. The route data can describe at least a portion of a structure of an interconnect in the package device, such as physical layout of traces, vias, and plane shapes on the various layers of the package device. The connectivity data can characterize at least a portion of an electrical interface between an integrated circuit implemented in the semiconductor die and the package device in the layout design 302. The connectivity data can include names of nets supported by the interface pins of the integrated circuit, which can be associated with the exported route data. The connectivity data also can identify a number of the interface pins on the integrated circuit, a layer of the package device coupling to the interface pins, a number of the interface pins associated with each net, locations of the interface pins, such as an x-y coordinate location on the semiconductor die, or the like. In some embodiments, the export unit 310 to extract route data and connectivity data from a different layout design for a different package device, for example, to be utilized in the layout design 302.

In some embodiments, the export unit 310 can identify the connectivity data by analyzing the library part and associated netlist associated with the integrated circuit, for example, to determine which nets of the integrated circuit correspond to which portions of the interconnect described in the layout design 302. For example, the export unit 310 can correlate traces or vias in the route data to the interface pins in the library part based on locations of trace or via endpoints relative to the locations of the interface pins in the library part. The export unit 310 can identify nets associated with the interface pins in the library part based on the netlist and assign the identified nets to traces or vias based on their correlation to the interface pins.

The export unit 310 also can generate a net mapping file separate from the connectivity data. The export unit 310 can generate the net mapping file for one or more nets, for example, nets not associated with interface pins in the library part. The package design tool 300, in some embodiments, can manage the net mapping file by reference to a defined export location in the layout design 302 of the package device.

The package design tool 300 can include a die update unit 320 to update the library part and netlist. In some embodiments, the die update unit 320 can replace the library part and associated netlist with the updated library part and associated updated netlist. The updated library part can include physical changes to the locations of the interface pins, a number of the interface pins, which nets are assigned to which of the interface pins, or the like. In some embodiments, the die update unit 320 can update the library part and associated netlist by utilizing the library part and netlist in a different portion of the layout design 302. This type of updated library part and associated updated netlist also can have different net names, different interface pin identifiers, or the like, than the library part and associated netlist.

The package design tool 300 can include a net mapping unit 330 to generate a net mapping matrix, which cross-references the route data exported from the layout design 302 with the information from the updated library part and associated updated netlist. The net mapping matrix can correlate the exported route data, such as traces, vias, and plane shapes, to the interface pins of the updated library part. In some embodiments, the net mapping unit 330 can utilize the exported connectivity data and/or net mapping file to correlate the exported route data with net assignments from the updated netlist, and then populate the net mapping matrix based on the correlation. For example, the net mapping unit 330 may identify net name changes for the interface pins that occurred during the update, and include identifiers of net name changes in the net mapping matrix.

The package design tool 300 can include an import unit 340 to utilize the exported route data, the exported connectivity data, and/or the net mapping file to modify the layout design 302 into the modified layout design 308, which supports the updated library part and the updated netlist. The import unit 340 can utilize the connectivity data, the net mapping file, and/or the net mapping matrix to correlate the route data with the interface pins in the updated library part and to assign net names in the modified layout design 308. The import unit 340, based on the correlation, can modify the route data so the interconnect aligns with the interface pins in the updated library part.

The import unit 340 can include a modification unit 342 to alter the connectivity data and/or the route data during an importation process. In some embodiments, the modification unit 342 can determine a difference in interface pin locations between the library part and the updated library part. The modification unit 342, based on the determined differences in the interface pin locations, can apply a scalar modification to the connectivity data and/or the route data during the importation process, which can attempt to align the connectivity data and/or the route data with the pin locations of the updated library part. When the updated library part is located in a different portion of the layout design 302 than the previous library part, the modification unit 342 also can rotate and/or mirror the route data and/or the connectivity data based on a location of the updated library part in the layout design 302 relative to the library part in the layout design 302. The modification unit 342 also can re-map one or more layers from a different layout design to the layout design 302, and modify the layout design 302 with route data associated with the different layout design based on the re-mapping. Embodiments of import data modification will be described below in greater detail.

The import unit 340 can include a net correlation unit 344 to identify differences in net names for interface pins between the library part and the updated library part, and assign the net names for the interconnect in the modified layout design 308 based, at least in part, on the identified differences. In some embodiments, the net correlation unit 344 can utilize the net mapping matrix to identify which net names were changed between the library part and the updated library part, and automatically assign net names to the route data used to modify the layout design 302 based on the identified net name changes. The net correlation unit 344 also can utilize the net mapping matrix to identify net names were changes between the layout design 302 and a different layout design, for example, during layer re-mapping.

The import unit 340 can include a realignment unit 346 to selectively re-align traces or locations of vias in the route data based on locations of the interface pins in the updated library part. The realignment unit 346 can utilize the modified connectivity data and/or the modified route data to identify which of the interface pins in the updated library part correspond to endpoints of the traces and vias in the route data. In some embodiments, the realignment unit 346 can determine distances between the endpoints of the traces and vias in the route data and the interface pins of the updated library part. When the determined distances fall within a threshold distance, the realignment unit 346 can automatically alter the route data so the endpoints of the traces or vias align with the interface pins of the updated library part. Embodiments of the route data re-alignment will be described below in greater detail.

Figure 4:
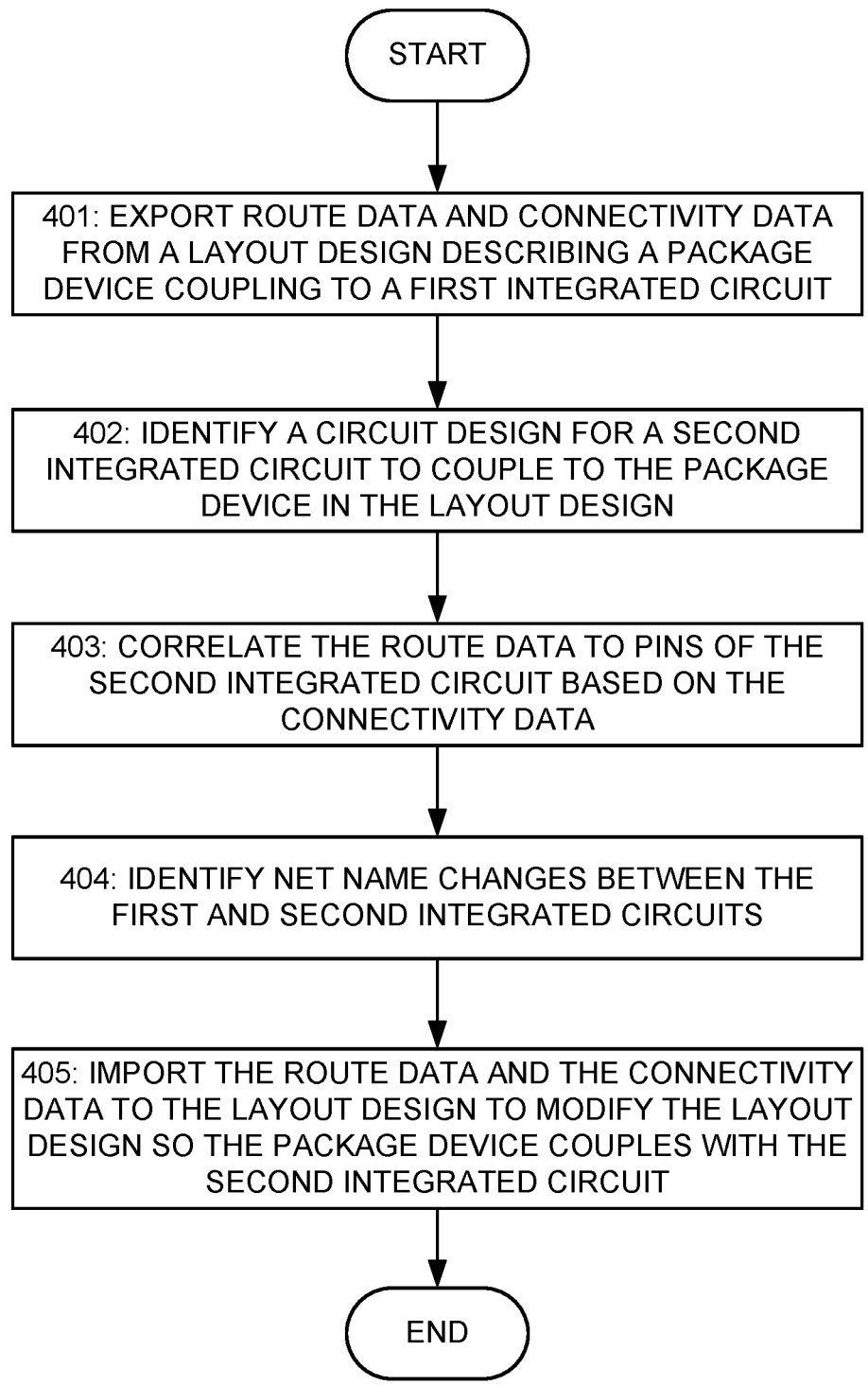
FIG. 4 illustrates an example flowchart for performing data resolution in a package layout design according to various examples of the invention.

FIG. 4 illustrates an example flowchart for performing data resolution in a package layout design according to various examples of the invention. Referring to FIG. 4, in a block 401, a computing system implementing a package design tool can export route data and connectivity data from a layout design describing a package device coupling to a first integrated circuit. The route data and the connectivity data can correspond to a portion of an interconnect in the package device coupling to the first integrated circuit in the layout design. In some embodiments, the computing system implementing the package design tool can identify the connectivity data by analyzing a circuit design of the first integrated circuit, such as a library part and a netlist.

In a block 402, the computing system implementing the package design tool can identify a circuit design for the second integrated circuit to couple to the package device in the layout design. In some embodiments, the computing system implementing the package design tool can update the circuit design for the first integrated circuit by replacing it with the circuit design for the second integrated circuit. In other embodiments, the computing system implementing the package design tool can update the circuit design for the first integrated circuit by generating the circuit design for the second integrated circuit based on the circuit design for the first integrated circuit, for example, deploying another instance of the circuit design for the first integrated circuit in a different location of the layout design. The first and second integrated circuits, in some embodiments, may be on a common die or chip, or on different dies or chips.

In a block 403, the computing system implementing the package design tool can correlate the route data to pins of the second integrated circuit based on the connectivity data. In some embodiments, the computing system implementing the package design tool can utilize the connectivity data to associate pins between the circuit designs for the first integrated circuit and the second integrated circuit, and then utilize this association between pins to correlate the route data to the pins of the second integrated circuit.

In a block 404, the computing system implementing the package design tool can identify net name changes between the first and second integrated circuits. The connectivity data can include net name assignments for the pins of the first integrated circuit. A netlist for the second integrated circuit can include net name assignments for the pins of the second integrated circuit. In some embodiments, the computing system implementing the package design tool can utilize the correlation of the pins between the circuit designs for the first integrated circuit and the second integrated circuit to compare net name assignments for correlated pins. When the computing system, based on the comparison, detects a different net name assignment on correlated pins, the computing system can identify a net name change.

In a block 405, the computing system implementing the package design tool can import the route data and the connectivity data to the layout design, which can modify the layout design so the interconnect in the package device couples to the second integrated circuit. The importation process utilizes the exported route data as the portion of the interconnect of the package device coupling to the second integrated circuit. The computing system can modify the route data, for example, by performing a scalar operation, a mirror operation, a rotate operation, or the like, based on differences in correlated pins between the first and second integrated circuits. The computing system can compare locations of endpoints of traces and vias in the modified route data to locations of pins in the second integrated circuit, and selectively re-align the endpoints of the traces and vias in the layout design to the pins in the second integrated circuit. The computing system also can utilize the net name changes between the first and second integrated circuits to assign net names to the route data coupled to the second integrated circuit in the layout design. Although FIG. 4 shows the operations of block 401-405 being performed in a common layout design, in some embodiments, the export operation can be performed from a first layout design and the import operation can be performed in a second layout design, which can allow for reuse and remapping of package device design data from the first layout design in the second layout design.

Figure 5:
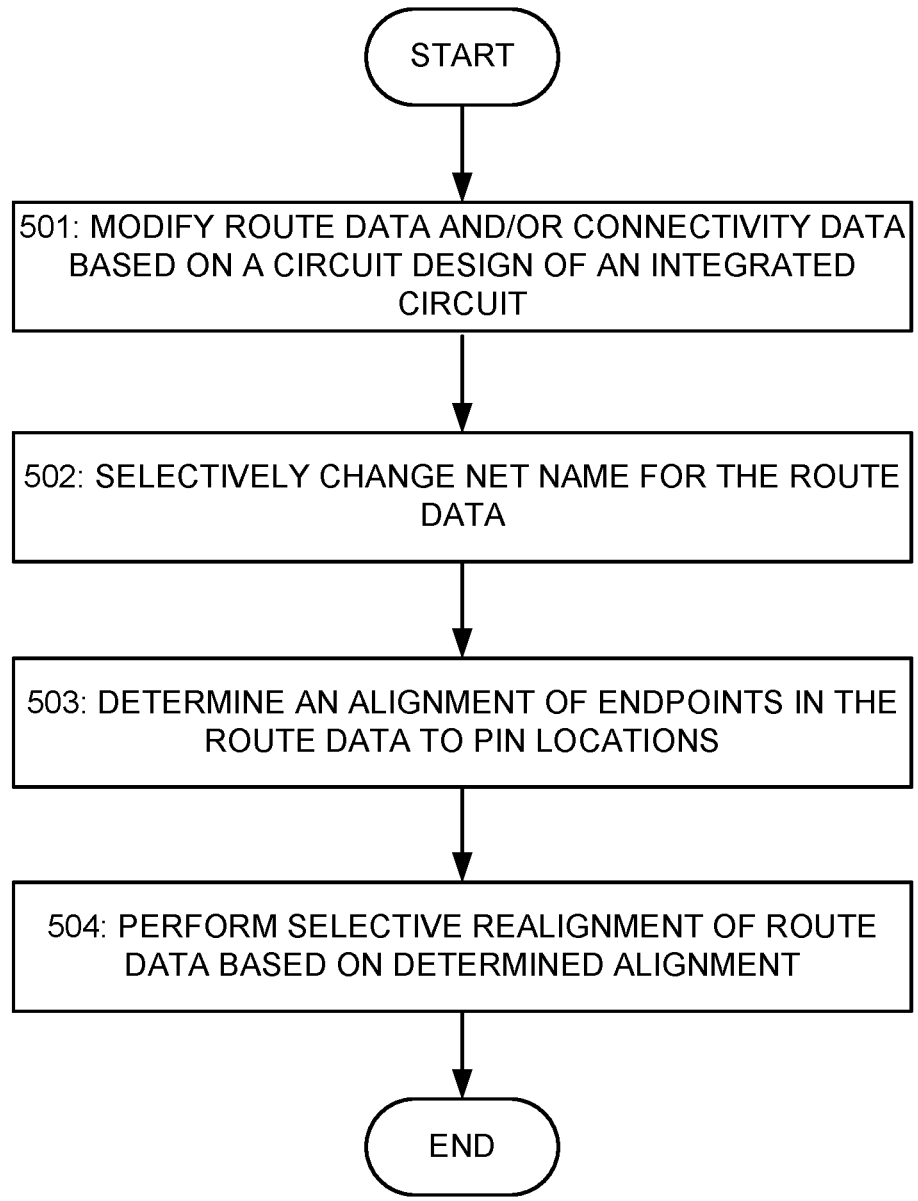
FIG. 5 illustrates an example flowchart for importing route and connectivity data in a package layout design according to various examples of the invention.

FIG. 5 illustrates an example flowchart for importing route and connectivity data in a package layout design according to various examples of the invention. Referring to FIG. 5, in a block 501, a computing system implementing a package design tool can modify route data and/or connectivity data based on a circuit design of an integrated circuit. The computing system can modify the route data and/or connectivity data, for example, by performing a scalar operation, a mirror operation, a rotate operation, or the like, based on differences in correlated pins between the first and second integrated circuits. Examples of the scalar, mirror, and rotate operations will be described below in FIGS. 6A-6D.

Figure 6A:
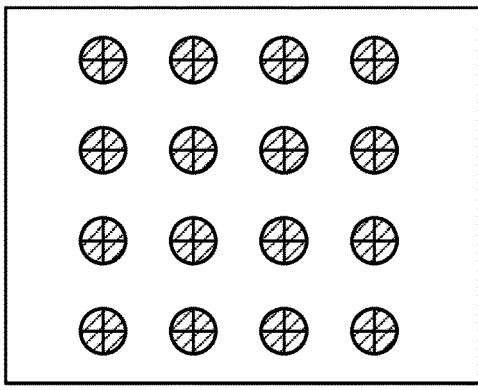
FIGS. 6A-6E illustrate examples of connectivity data modification according to various examples of the invention.

FIGS. 6A-6E illustrate examples of connectivity data modification according to various examples of the invention. Referring to FIG. 6A, a layout design 600 of a package device 610 can include an interconnect configured to couple with a first integrated circuit having integrated circuit pins 612. In some embodiments, the interconnect can include traces or vias, the endpoints of which can align with the integrated circuit pins 612. During an export process, a computing system implementing a package design tool can identify where the interconnect of the package device 610 is configured to couple with the integrated circuit pins 612 and generate connectivity data 611 to describe the electrical interface between the package device 610 and the integrated circuit pins 612 described in the layout design 600.

Figure 6B:
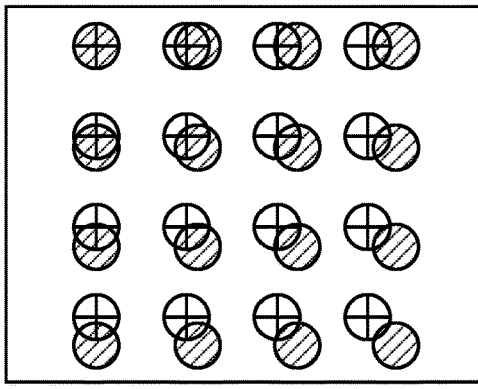

Referring to FIG. 6B, the layout design 600 of the package device 610 is shown relative to a second integrated circuit having updated integrated circuit pins 613. In some embodiments, the second integrated circuit can correspond to the first integrated circuit, for example, modified to improve manufacturing yield or reliability. The computing system implementing the package design tool can, during an import process, identify that the connectivity data 611 is misaligned with the updated integrated circuit pins 613 of the second integrated circuit, and automatically apply a scalar to the connectivity data 611 in an attempt to align the connectivity data 611 with the updated integrated circuit pins 613 of the second integrated circuit. The scalar operation can modify a pitch of the connectivity data 611 or distance between the representations of pins or bumps in the package device 610. In some embodiments, the computing system implementing the package design tool can utilize the identified misalignment between the connectivity data 611 and the updated integrated circuit pins 613 of the second integrated circuit to modify the interconnect of the package device 610 described in the layout design 600.

Figure 6C:
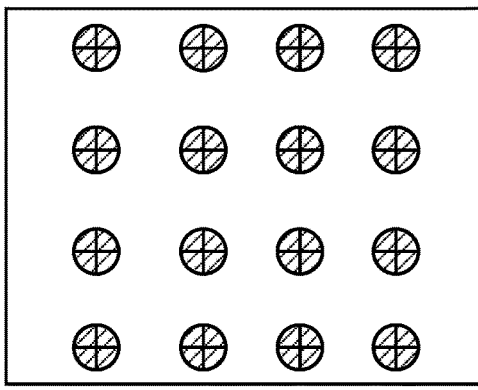

Referring to FIG. 6C, a modified layout design 601 shows a package device 620 having modified connectivity data 621 to align with the updated integrated circuit pins 613 of the second integrated circuit. In some embodiments, the scalar operation can be performed in multiple different directions, such as an x-direction and a y-direction as shown here, but may also be performed in other 2-dimensional or 3-dimensional directions.

Figure 6D:
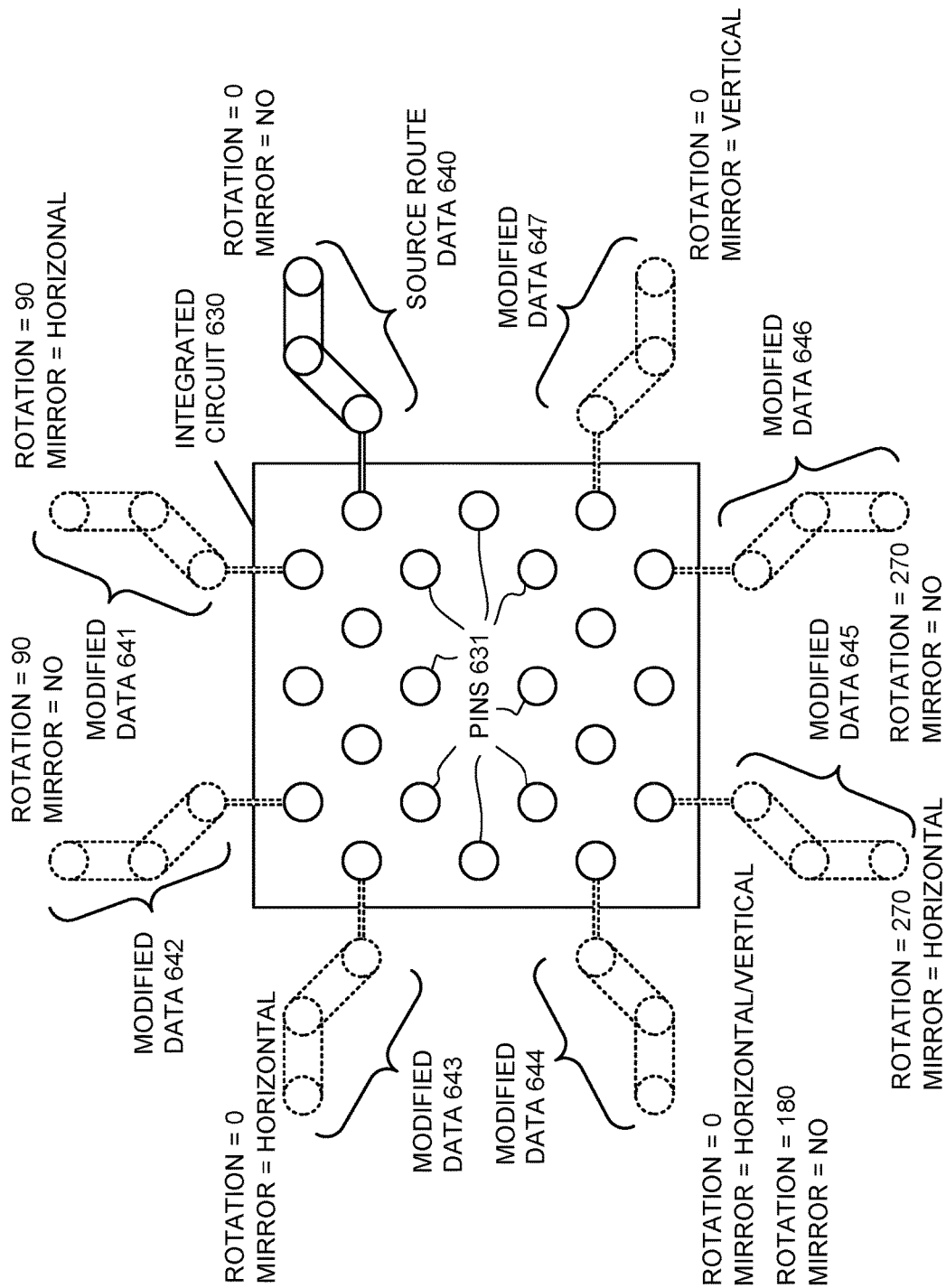

Referring to FIG. 6D, a layout design of a package device can include an interconnect configured to couple with an integrated circuit 630 having integrated circuit pins 631. During an export process, a computing system implementing a package design tool can output route data corresponding to the interconnect, such as traces, vias, plane shapes, or the like. For example, the layout design of the package device includes source route data 640, which can describe at least a portion of the interconnect configured to couple with the integrated circuit 630. In this example, the source route data 640 can include trace coupled to one of the pins 631, which can be located at least partially under the integrated circuit 630 in the package device, and include multiple vias (shown as circles in FIG. 6D) which can define a route for electrical connectivity through different layers of the package device.

In some embodiments, the computing system implementing the package design tool may reuse the source route data 640 to form a different portion of the interconnect coupling to a different pin 631 of the integrated circuit 630. In some embodiments, the computing system can identify a different one of the pins 631 to build an associated portion of the interconnect in the package device and, based on the location of the pin relative to the pin coupled to the source route data 640, apply a mirror operation and/or a rotation operation to the source route data 640 to form the associated portion of the interconnect in the package device. The mirror operation can modify the source route data 640 by inverting the configuration of the source route data 640 around at least one axis, for example, horizontally, vertically, a combination thereof, or the like. The rotation operation can modify the source route data 640 by revolving the source route data 640 around a center of rotation, which can be performed with one or more preset rotational degree settings, such as 90 degrees, 180 degrees, 270 degrees, or the like.

Examples of the source route data 640 been modified by various mirror and/or rotate operations are shown as modified data 641-647 in FIG. 6D. The computing system implementing the package design tool can utilize the modified data 641-647 to generate at least another portion of the interconnect and align the modified data 641-647 to couple with different pins 631 in the integrated circuit 630. Although FIG. 6D shows reuse of the source route data 640 to generate different portions of the interconnect for in the layout design of the package device, in some embodiments, the source route data 640 could be utilized to build a portion of the interconnect coupling to a different integrated circuit or located in a different package design.

Figure 6E:
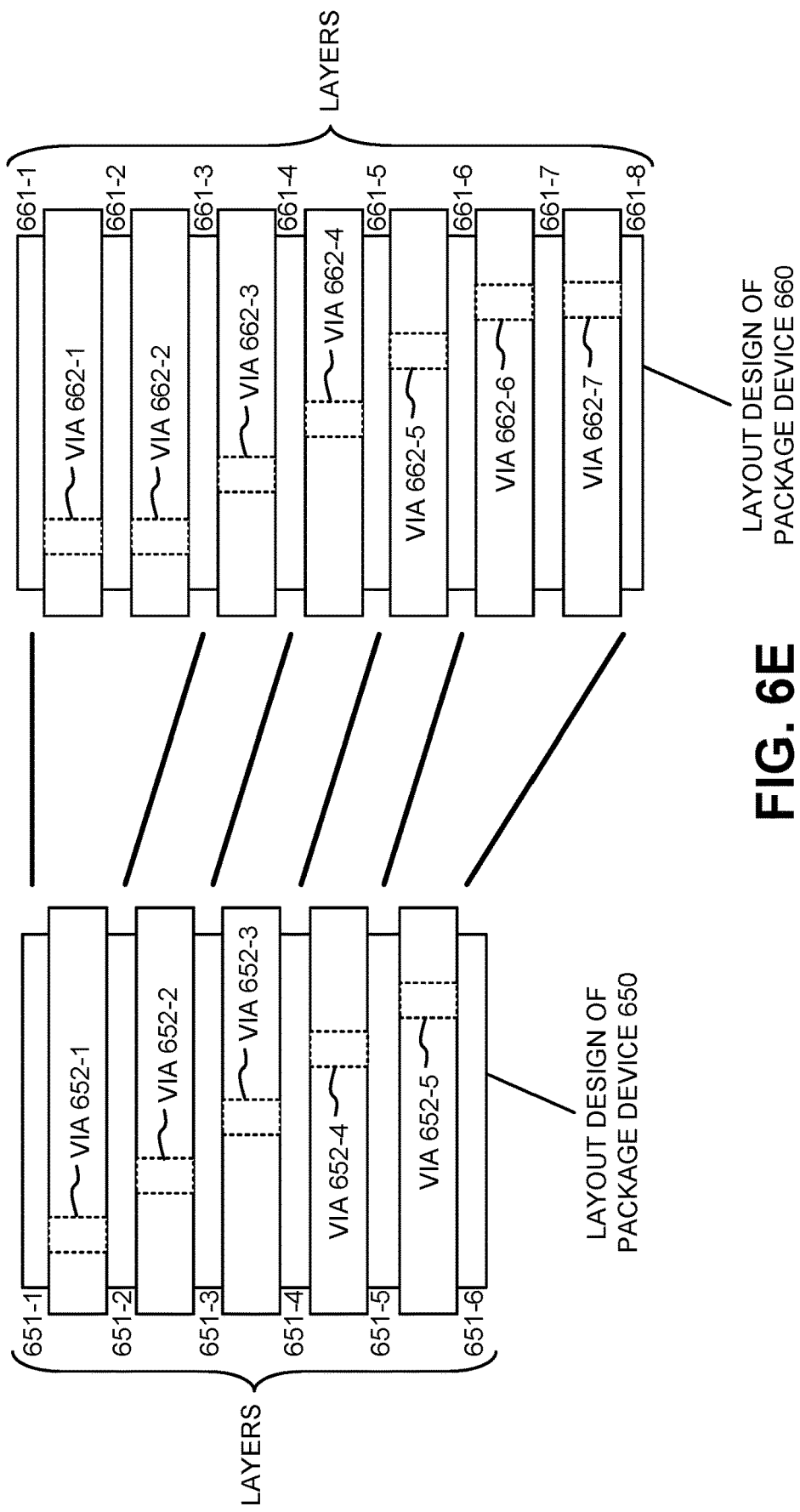

Referring to FIG. 6E, a layout design of a package device 650 can include multiple different layers 651-1 to 651-6 coupled by corresponding vias 652-1 to 652-5. In some embodiments, the layers 651-1 to 651-6 and the vias 652-1 to 652-5 can include at least a portion of an interconnect in the layout design of a package device 650. During an export process, the computing system implementing a package design tool can export design data corresponding to the layers 651-1 to 651-6 and the vias 652-1 to 652-5, which can include data corresponding to a physical description of the interconnect as well as data corresponding to connectivity of the interconnect to an external electronic device.

During an import process, the computing system implementing the package design tool can import and remap the exported design data into a different a layout design of a package device 660. The layout design of the package device 660 can include multiple different layers 661-1 to 661-8 coupled together by vias 662-1 to 662-7. The layers 651-1 to 651-6 can be disposed on different layers of the layout design of the package device 660 than on the layout design of the package device 650. For example, the layers 651-1, 651-2, 651-3, 651-4, 651-5, and 651-6 in the layout design of the package device 650 can be remapped to the layers 661-1, 661-3, 661-4, 661-5, 661-6, and 661-8, respectively, in the layout design of the package device 660. The vias 652-1, 652-2, 652-3, 652-4, and 652-5 in the layout design of the package device 650 can be remapped to the vias 662-1, 662-3, 662-4, 662-5, and 662-7, respectively, in the layout design of the package device 660. The vias 652-1 and 652-5 can also be utilized to for stack adjustment, for example, to generate the vias 662-2 and 662-6, respectively, in the layout design of the package device 660.

Referring back to FIG. 5, in a block 502, the computing system implementing the package design tool can selectively change net names for the route data, for example, based on a net mapping matrix. In some examples, the computing system can utilize the net mapping matrix to identify net name changes for traces, via, and plane shapes in the route data, and assign net names to the route data based on the identified net name changes.

In a block 503, the computing system implementing the package design tool can determine an alignment of endpoints in the route data to pin locations in the integrated circuit, and in a block 504, the computing system implementing the package design tool can perform selective realignment of route data based on determined alignment. The computing system can utilize the modified connectivity data and/or the modified route data, for example, determined in block 501, to identify which of the pins are correlated to endpoints of the traces and vias in the route data. In some embodiments, the computing system can determine distances between the endpoints of the traces and vias in the route data and the pins of the integrated circuit. When the determined distances fall within a threshold distance, the computing system can automatically alter the route data so the endpoints of the traces or vias align with the pins of the integrated circuit. Examples of the re-alignment operations will be described below in FIGS. 7A and 7B.

Figure 7A:
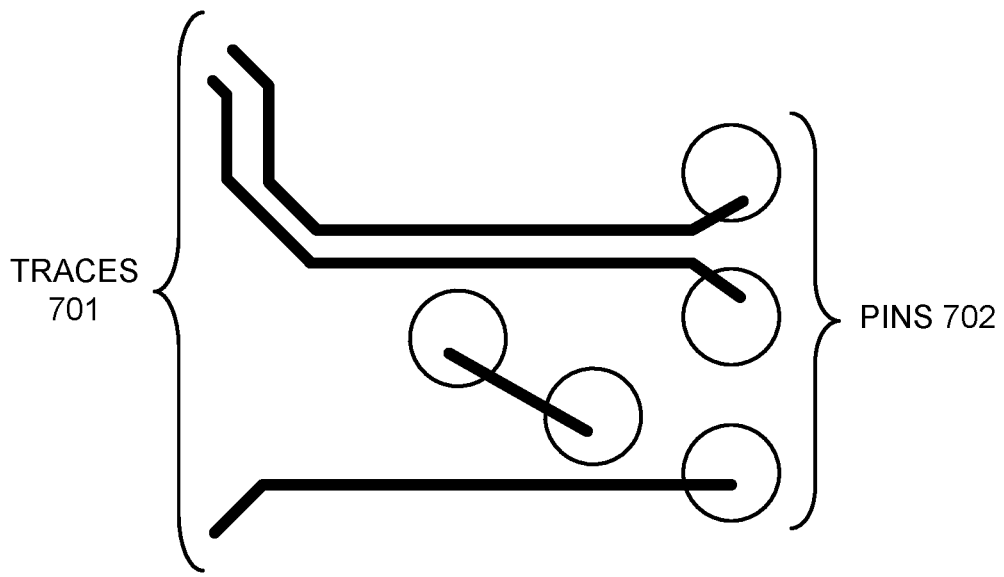
FIGS. 7A and 7B illustrate an example of route data realignment according to various examples of the invention.
Figure 7B:
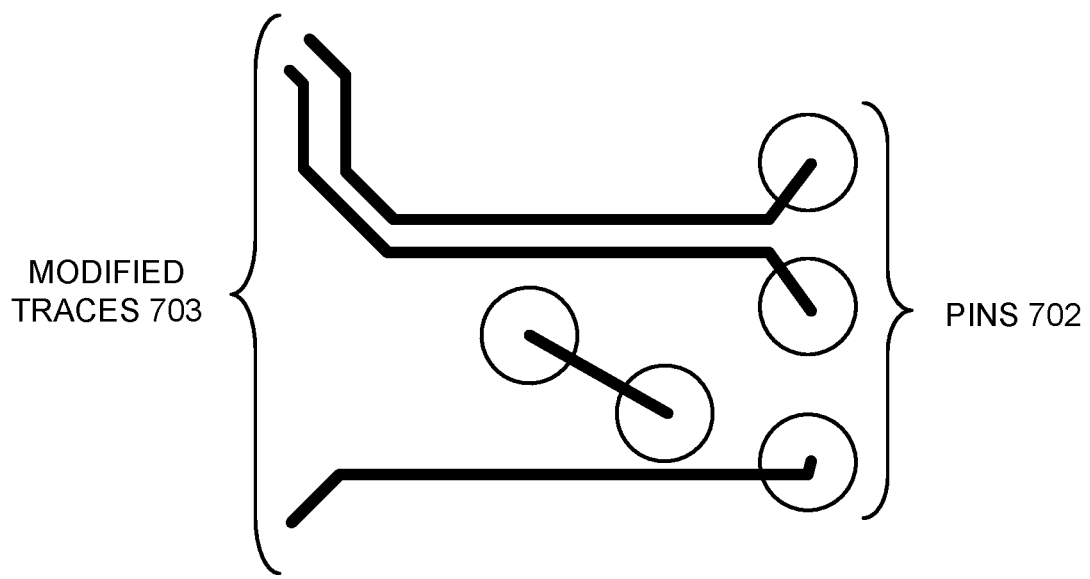

FIGS. 7A and 7B illustrate an example of route data realignment according to various examples of the invention. Referring to FIGS. 7A and 7B, a portion of an interconnect in a layout design of a package device can include traces 701, shown as lines. In some embodiments, during importation a computing system implementing a package design tool can utilize route data to generate the traces 701, which can be misaligned with the pins 702, shown as circles, in an integrated circuit. For example, the traces 701 have their endpoints falling outside of a center of a respective pin 702.

The computing system implementing the package design tool can determine which traces 701 correlate to which pins 702, for example, based on connectivity data exported from a layout design prior to the importation process, and identify when endpoints of the traces 701 are misaligned to their correlated pins 702. The computing system implementing the package design tool can automatically realign the traces 701 to their correlated pins 702 by modifying the traces 701 so that their endpoints fall approximately in the center of the pins 702. These modified traces 703 can be utilized by the computing system to generate or modify the interconnect coupling to the pins 702 of the integrated circuit.

For example, when the endpoints of the traces 701 are misaligned with corresponding pins 702, but within a predetermined threshold distance from each other, the computing system can automatically alter the traces 701 to re-align the endpoints of the traces 701 to the pins 702. In some embodiments, the computing system can modify the traces 701 by moving at least one section of a trace, by adding a section to a trace, deleting at least a portion of a section of a trace, modifying or shifting at least one trace coupled between multiple pins, or the like. Although FIGS. 7A and 7B show trace re-alignment via an importation process, in some embodiments, the computing system can re-align vias and/or plane shapes during the importation process.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable memory device" (or alternatively, "machine-readable storage device") may include all of the foregoing types of memory, as well as new technologies of the future, as long as the memory device may be capable of storing digital information in the nature of a computer program or other data, at least temporarily, and as long at the stored information may be "read" by an appropriate processing device. The term "computer-readable" may not be limited to the historical usage of "computer" to imply a complete mainframe, minicomputer, desktop or even laptop computer. Rather, "computer-readable" may comprise any device that may be readable by a processor, a processing device, or any computing system. Such devices may be any available device that may be locally and/or remotely accessible by a computer or a processor, and may include volatile and non-volatile devices, and removable and non-removable devices, or any combination thereof.

A program stored in a computer-readable memory device may comprise a computer program product. For example, a memory device may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   extracting, by a computing system, route data and connectivity data from a layout design of a package device, wherein the route data is configured to describe a structure of an interconnect connected to pins of a first integrated circuit and pins of the package device, and wherein the connectivity data is configured to characterize an electrical interface between the pins of the first integrated circuit and the pins of the package device in the layout design;
   associating, by the computing system, the pins of the first integrated circuit with pins of a second integrated circuit;
   correlating, by the computing system, the route data, describing the structure of the interconnect connected to pins of to first integrated circuit, to the pins of the second integrated circuit based on the connectivity data associated with the pins of the first integrated circuit and the associations between the pins of the first integrated circuit with the pins of the second integrated circuit; and
   importing, by the computing system, the route data and the connectivity data to the layout design, which automatically modifies the layout design having the route data describing the structure of the interconnect connected to the pins of the first integrated circuit by realigning at least a portion of the route data in the layout design to connect the pins in the second integrated circuit to the pins of the package device based on the correlation.

2. The method of claim 1, wherein correlating the route data to pins in the second integrated circuit further comprises building a net mapping matrix that associates the route data to the pins in the second integrated circuit and identifies net names for the route data and the second integrated circuit, and wherein importing the route data and the connectivity data further comprises utilizing the net mapping matrix to perform the realignment and to change net names corresponding to the route data.

3. The method of claim 1, wherein importing the route data and the connectivity data to the layout design further comprises modifying the connectivity data based on locations of the pins in the second integrated circuit relative to the package device in the layout design.

4. The method of claim 3, wherein modifying the connectivity data includes at least one of applying a scaling operation to the connectivity data, applying a mirror operation to the connectivity data, or applying a rotation operation to the connectivity data.

5. The method of claim 1, wherein the route data includes at least one of traces, vias, or plane shapes in the layout design, and wherein the connectivity data includes at least one of layers in the package device, locations for the package device to electrically connect to pins in the first integrated circuit, identifiers of the pins in the first integrated circuit, a number of the pins in nets associated with the first integrated circuit, or names of the nets.

6. The method of claim 1, further comprising replacing, in the layout design, a library part corresponding to the first integrated circuit with a library part and netlist corresponding to the second integrated circuit, wherein importing the route data and the connectivity data to the layout design further comprises modifying the package device in the layout design to couple to the library part and netlist corresponding to the second integrated circuit.

7. The method of claim 1, further comprising adding a library part and netlist corresponding to the second integrated circuit to the layout design, wherein importing the route data and the connectivity data to the layout design further comprises replicating a portion of the package device in the layout design corresponding to the first integrated circuit for modification and use in another portion of the package design.

8. A system comprising:
   a memory device configured to store machine-readable instructions; and
   a computing system including one or more processing devices, in response to executing the machine-readable instructions, configured to:
      extract route data and connectivity data from a layout design of a package device, wherein the route data is configured to describe a structure of an interconnect connected to pins of a first integrated circuit and pins of the package device, and wherein the connectivity data is configured to characterize an electrical interface between the pins of the first integrated circuit and the package device in the layout design;
      associate the pins of the first integrated circuit with pins of a second integrated circuit;
      correlate the route data, describing the structure of the interconnect connected to pins of to first integrated circuit, to the pins of the second integrated circuit based on the connectivity data associated with the pins of the first integrated circuit and the associations between the pins of the first integrated circuit with the pins of the second integrated circuit; and
      import the route data and the connectivity data to the layout design, which automatically modifies the layout design having the route data describing the structure of the interconnect connected to the pins of the first integrated circuit by realigning at least a portion of the route data in the layout design to connect the pins in the second integrated circuit to the pins of the package device based on the correlation.

9. The system of claim 8, wherein the one or more processing devices, in response to executing the machine-readable instructions, are configured to:
build a net mapping matrix that associates the route data to the pins in the second integrated circuit and identifies net names for the route data and the second integrated circuit; and
utilize the net mapping matrix to perform the realignment and to change net names corresponding to the route data.

10. The system of claim 8, wherein the one or more processing devices, in response to executing the machine-readable instructions, are configured to modify the connectivity data based on locations of the pins in the second integrated circuit relative to the package device in the layout design.

11. The system of claim 8, wherein the route data includes at least one of traces, vias, or plane shapes in the layout design, and wherein the connectivity data includes at least one of layers in the package device, locations for the package device to electrically connect to pins in the first integrated circuit, identifiers of the pins in the first integrated circuit, a number of the pins in nets associated with the first integrated circuit, or names of the nets.

12. The system of claim 8, wherein the one or more processing devices, in response to executing the machine-readable instructions, are configured to:
replace, in the layout design, a library part corresponding to the first integrated circuit with a library part and netlist corresponding to the second integrated circuit; and
modify the package device in the layout design to couple to the library part and netlist corresponding to the second integrated circuit.

13. The system of claim 8, wherein the one or more processing devices, in response to executing the machine-readable instructions, are configured to:
add a library part and netlist corresponding to the second integrated circuit; and
replicate a portion of the package device in the layout design corresponding to the first integrated circuit for modification and use in another portion of the package design.

14. An apparatus including a memory device storing instructions configured to cause one or more processing devices to perform operations comprising:
extracting route data and connectivity data from a layout design of a package device, wherein the route data is configured to describe a structure of an interconnect connected to pins of a first integrated circuit and pins of the package device, and wherein the connectivity data is configured to characterize an electrical interface between the pins of the first integrated circuit and the package device in the layout design;
associating the pins of the first integrated circuit with pins of a second integrated circuit;
correlating the route data, describing the structure of the interconnect connected to pins of to first integrated circuit, to the pins of the second integrated circuit based on the connectivity data associated with the pins of the first integrated circuit and the associations between the pins of the first integrated circuit with the pins of the second integrated circuit; and
importing the route data and the connectivity data to the layout design, which automatically modifies the layout design having the route data describing the structure of the interconnect connected to the pins of the first integrated circuit by realigning at least a portion of the route data in the layout design to connect the pins in the second integrated circuit to the pins of the package device based on the correlation.

15. The method of claim 14, wherein correlating the route data to pins in the second integrated circuit further comprises building a net mapping matrix that associates the route data to the pins in the second integrated circuit and identifies net names for the route data and the second integrated circuit, and wherein importing the route data and the connectivity data further comprises utilizing the net mapping matrix to perform the realignment and to change net names corresponding to the route data.

16. The method of claim 14, wherein importing the route data and the connectivity data to the layout design further comprises modifying the connectivity data based on locations of the pins in the second integrated circuit relative to the package device in the layout design.

17. The method of claim 16, wherein modifying the connectivity data includes at least one of applying a scaling operation to the connectivity data, applying a mirror operation to the connectivity data, or applying a rotation operation to the connectivity data.

18. The method of claim 14, wherein the route data includes at least one of traces, vias, or plane shapes in the layout design, and wherein the connectivity data includes at least one of layers in the package device, locations for the package device to electrically connect to pins in the first integrated circuit, identifiers of the pins in the first integrated circuit, a number of the pins in nets associated with the first integrated circuit, or names of the nets.

19. The method of claim 14, wherein the instructions are configured to cause one or more processing devices to perform operations further comprising replacing, in the layout design, a library part corresponding to the first integrated circuit with a library part and netlist corresponding to the second integrated circuit, and wherein importing the route data and the connectivity data to the layout design further comprises modifying the package device in the layout design to couple to the library part and netlist corresponding to the second integrated circuit.

20. The method of claim 14, wherein the instructions are configured to cause one or more processing devices to perform operations further comprising adding a library part and netlist corresponding to the second integrated circuit, and wherein importing the route data and the connectivity data to the layout design further comprises replicating a portion of the package device in the layout design corresponding to the first integrated circuit for modification and use in another portion of the package design.

* * * * *